United States Patent
Shepston et al.

(10) Patent No.: US 7,411,440 B2
(45) Date of Patent: Aug. 12, 2008

(54) SYSTEM LOCATED IN AN INTEGRATED CIRCUIT FOR REDUCING CALIBRATION COMPONENTS

(75) Inventors: Shad R. Shepston, Thornton, CO (US); Yong Wang, Fort Collins, CO (US); Jason Harold Culler, Livermore, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 491 days.

(21) Appl. No.: 11/180,096

(22) Filed: Jul. 12, 2005

(65) Prior Publication Data

US 2007/0024334 A1 Feb. 1, 2007

(51) Int. Cl.
*H03K 17/00* (2006.01)

(52) U.S. Cl. ............... 327/407; 327/408; 327/409; 327/410

(58) Field of Classification Search ......... 327/407–413; 326/30
See application file for complete search history.

(56) References Cited

U.S. PATENT DOCUMENTS

| 5,600,271 A | * | 2/1997 | Erickson et al. ............. 327/108 |
| 6,281,687 B1 | | 8/2001 | Shepston |
| 7,262,632 B2 | * | 8/2007 | Hazucha et al. ............... 326/38 |

FOREIGN PATENT DOCUMENTS

GB 2375446 A 11/2002

* cited by examiner

*Primary Examiner*—Kenneth B. Wells
*Assistant Examiner*—John W Poos

(57) ABSTRACT

An embodiment of this invention provides a circuit and method for reducing the number of electronic components needed to calibrate circuits on an IC. A multiplexer is located on the IC where the outputs of a plurality of circuits located on the IC are each connected to a separate data input of the multiplexer. The control input of the multiplexer selects which data input of the multiplexer is connected to an external component. Each data input is individually connected to the component periodically.

4 Claims, 7 Drawing Sheets

US 7,411,440 B2

SYSTEM LOCATED IN AN INTEGRATED CIRCUIT FOR REDUCING CALIBRATION COMPONENTS

FIELD OF THE INVENTION

This invention relates generally to packaged integrated electronic circuits. More particularly, this invention relates to reducing the number of calibration components required for packaged integrated electronic circuits.

BACKGROUND OF THE INVENTION

External reference components are often used to calibrate the performance of an individual circuit on an integrated circuit (IC). These components include but are not limited to passive components such as resistors, capacitors, and inductors. These components also include but are not limited to active components such as op-amps, voltage regulators, and current regulators. The number of external reference components used to calibrate individual circuits on an IC add to the cost of producing ICs, components, electrical boards, and computer systems. One method used to reduce the cost of producing ICs is to reduce the number of external reference components used to calibrate or test ICs.

There is a need in the art to reduce the number of components used to calibrate integrated circuits. An embodiment of this invention reduces the number of reference resistors required to calibrate optimal output impedance for off-chip drivers on an IC.

DETAILED DESCRIPTION OF THE PREFERRED EMBODIMENT

Figure 1:
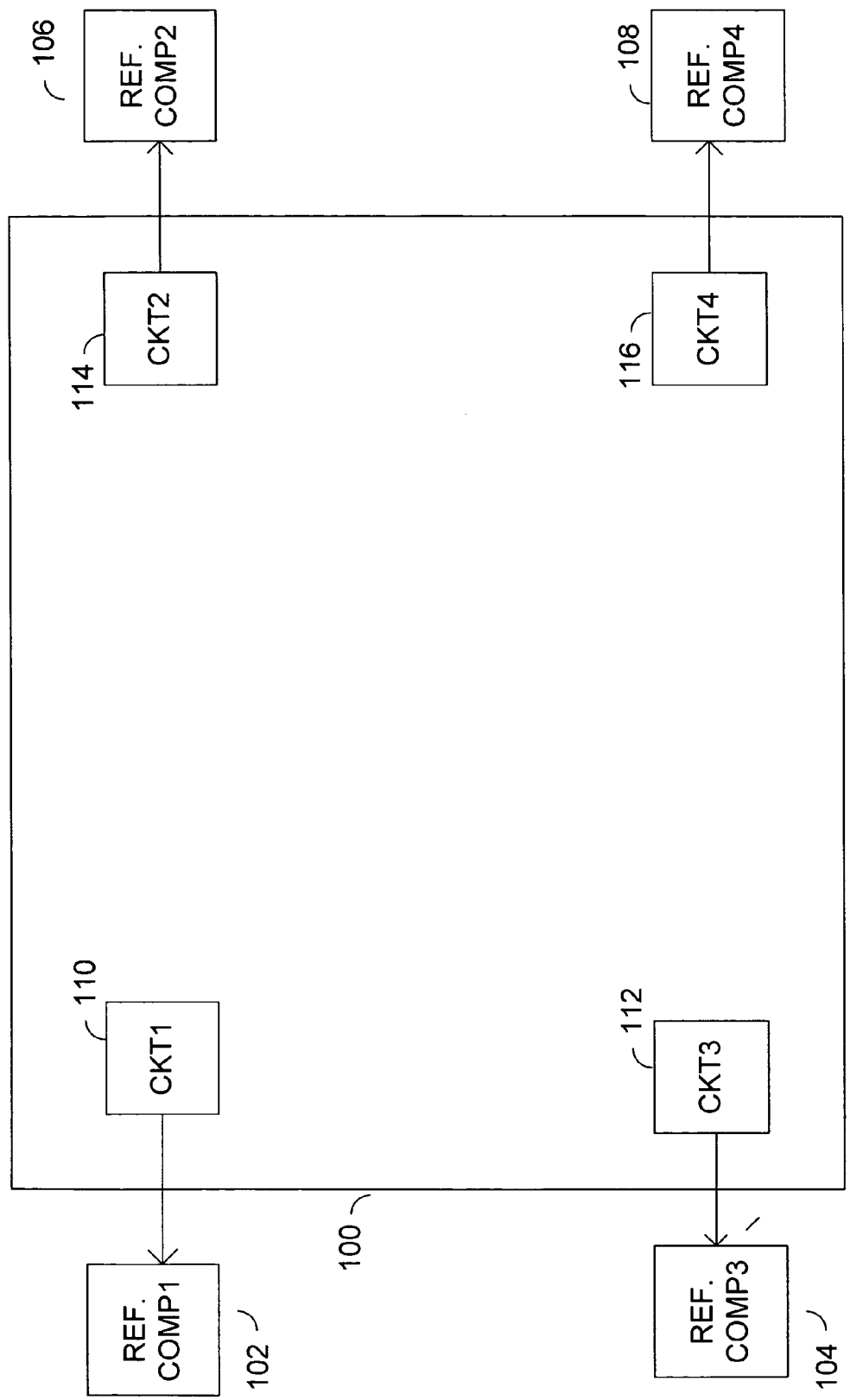
FIG. 1 is a drawing of an IC with four external components. Prior Art

FIG. 1 is a drawing of an integrated circuit (IC), 100, with four external components, 102, 104, 106, and 108. Reference component1, 102, is used to calibrate the circuit, CKT1, 110 on the IC, 100. Reference component2, 106, is used to calibrate the circuit, CKT2, 114 on the IC, 100. Reference component3, 104, is used to calibrate the circuit, CKT3, 112 on the IC, 100. Reference component4, 108, is used to calibrate the circuit, CKT4, 116 on the IC, 100. In this example each internal circuit has a separate external component used for calibration.

Figure 2:
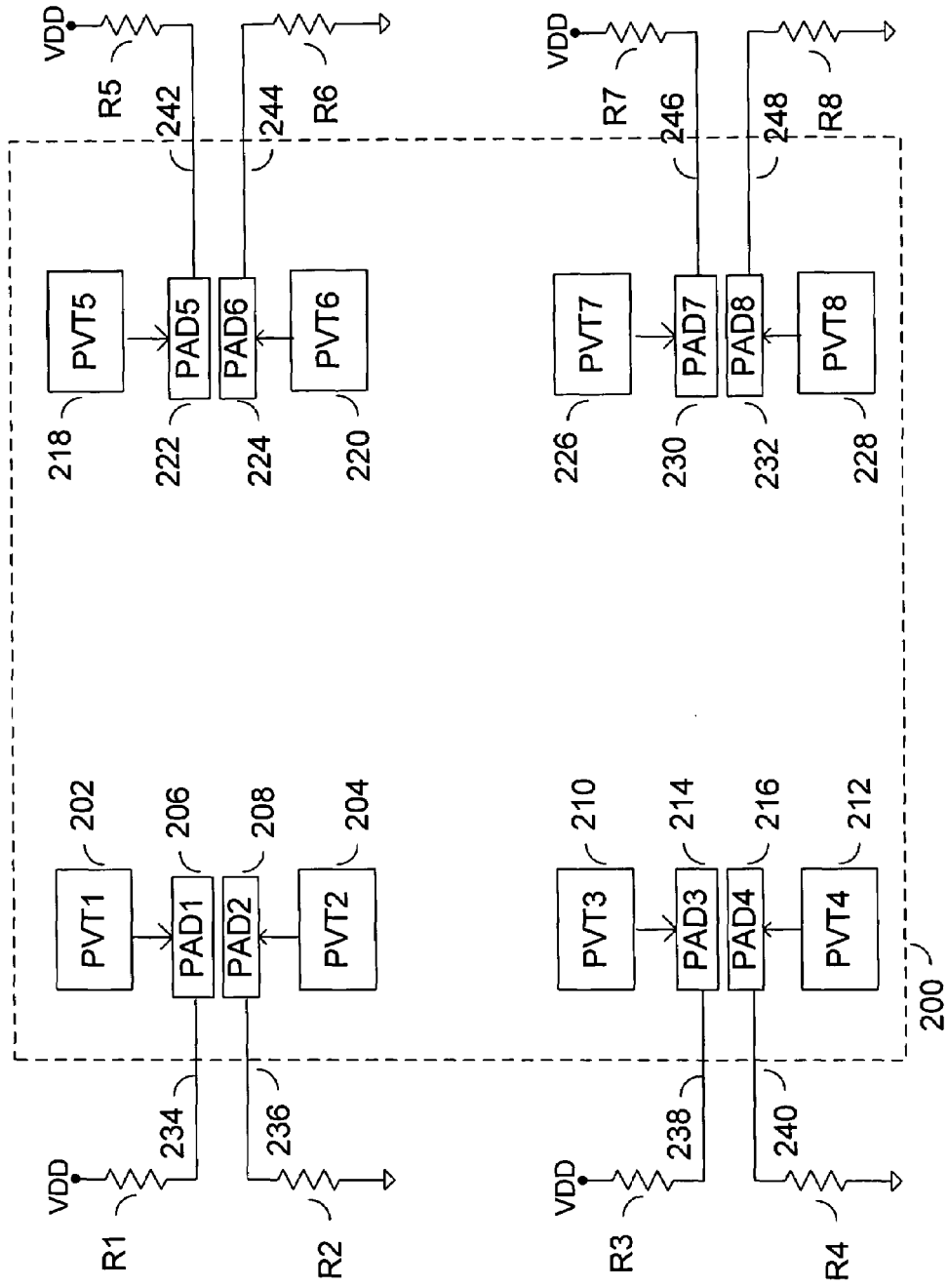
FIG. 2 is a drawing of an IC with eight external resistors. Prior Art
Figure 2A:
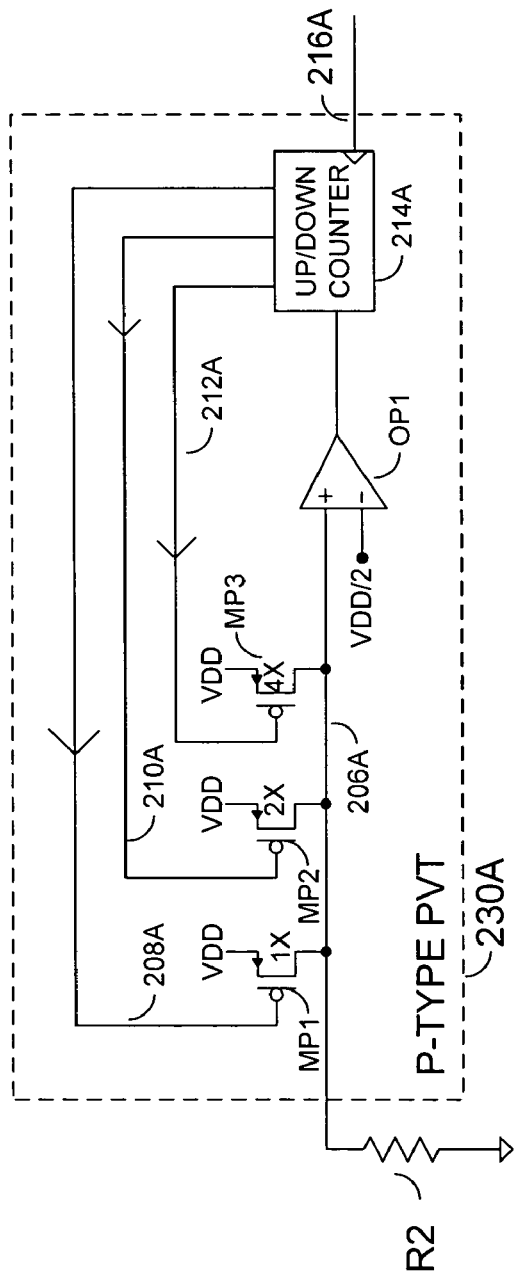
FIG. 2A is a schematic drawing of P-type and N-type PVT circuits. Prior Art
Figure 2A:
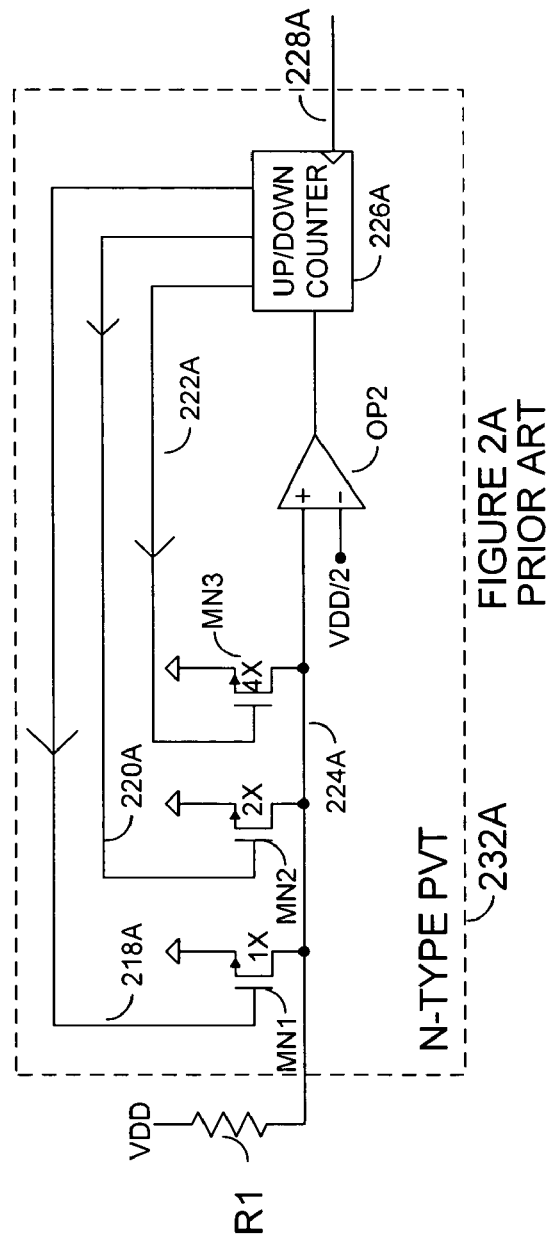

FIG. 2 is a drawing of an IC, 200, with eight external resistors, R1, R2, R3, R4, R5, R6, R7, and R8. The process-voltage-temperature circuits (PVT), PVT1, 202, PVT2, 204, PVT3, 210, PVT4, 212, PVT5, 218, PVT6, 220, PVT7, 226, and PVT8, 228, are described in FIG. 2A. PVT1, 202, PVT3, 210, PVT5, 218, and PVT7, 226 are N-type PVT circuits, 232A. The output impedance of the N-type PVT circuit, 232A, may be adjusted by selecting the appropriate combination of NFETs, MN1, MN2, and MN3. Usually, the desired combination of NFETs, MN1, MN2, and MN3 result in a voltage on node 224A of VDD/2. When this configuration occurs, the output impedance of the N-type PVT circuit, 232A, is approximately equal to the resistance of the external resistor, R1. One advantage of this configuration is that it helps reduce reflections due to impedance mismatch.

PVT2, 204, PVT4, 212, PVT6, 220, and PVT8, 228, are P-type PVT circuits, 230A. The output impedance of the P-type PVT circuit, 230A, may be adjusted by selecting the appropriate combination of PFETs, MP1, MP2, and MP3. Usually, the desired combination of PFETs, MP1, MP2, and MP3 result in a voltage on node 206A of VDD/2. When this configuration occurs, the output impedance of the P-type PVT circuit, 2062A, is approximately equal to the resistance of the external resistor, R2. One advantage of this configuration is that it helps reduce reflections due to impedance mismatch.

In FIG. 2, there are also eight pads, PAD1, 206, PAD2, 208, PAD3, 214, PAD4, 216, PAD5, 222, PAD6, 224, PAD7, 230, and PAD8, 232. PVT1, 202, is connected to PAD1, 206, and PAD1, 206, is connected to one end, 234, of resistor, R1. PVT2, 204, is connected to PAD2, 208, and PAD2, 208, is connected to one end, 236, of resistor, R2. PVT3, 210, is connected to PAD3, 214, and PAD3, 214, is connected to one end, 238, of resistor, R3. PVT4, 212, is connected to PAD4, 216, and PAD4, 216, is connected to one end, 240, of resistor, R4. PVT5, 218, is connected to PAD5, 222, and PAD5, 222, is connected to one end, 242, of resistor, R5. PVT6, 220, is connected to PAD6, 224, and PAD6, 224, is connected to one end, 244, of resistor, R6. PVT7, 226, is connected to PAD7, 230, and PAD7, 230, is connected to one end, 246, of resistor, R7. PVT8, 228, is connected to PAD8, 232, and PAD8, 232, is connected to one end, 248, of resistor, R8.

Figure 3:
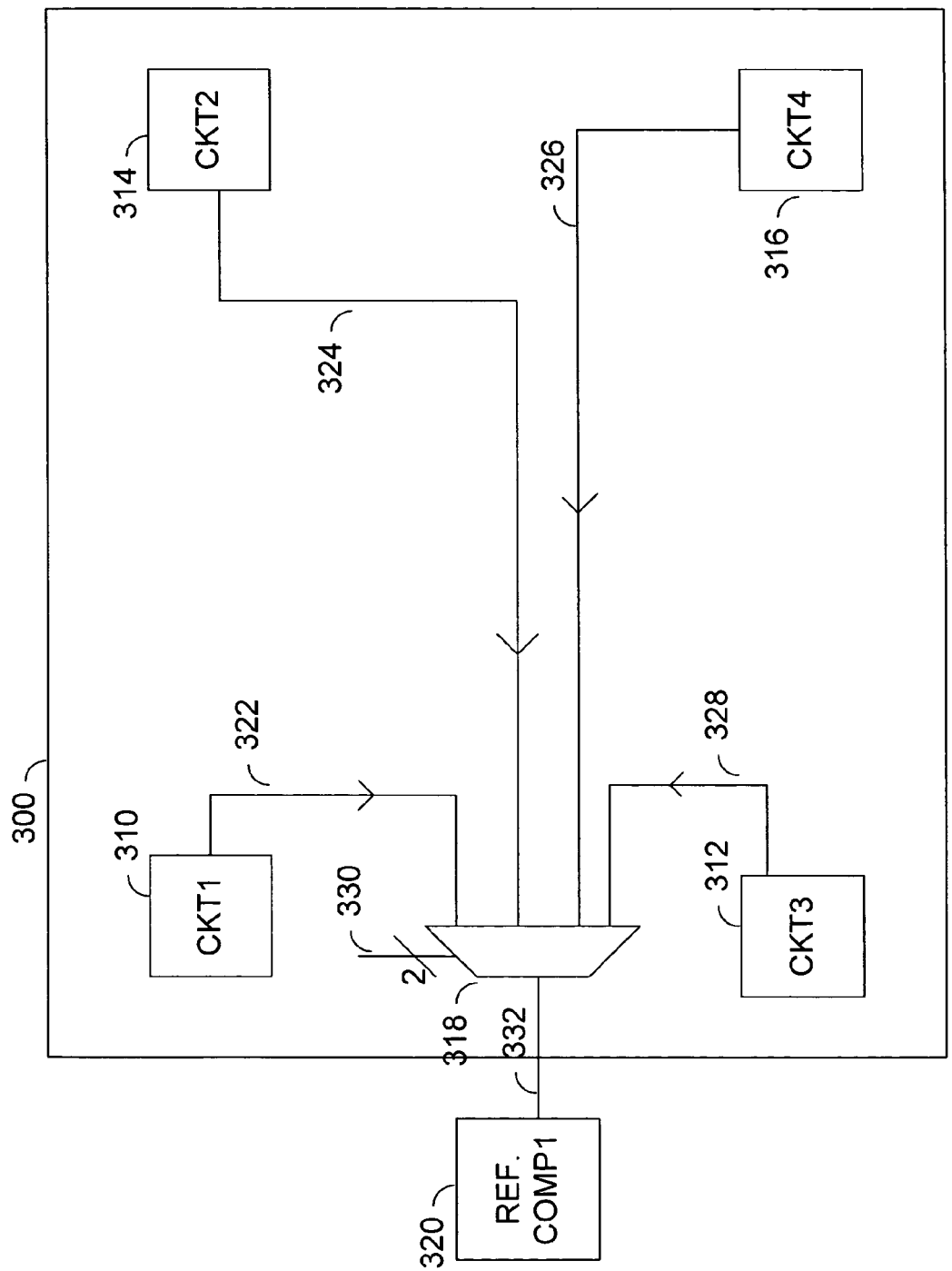
FIG. 3 is a drawing of an example of an IC with one multiplexer and four circuits with one external component.
Figure 3A:
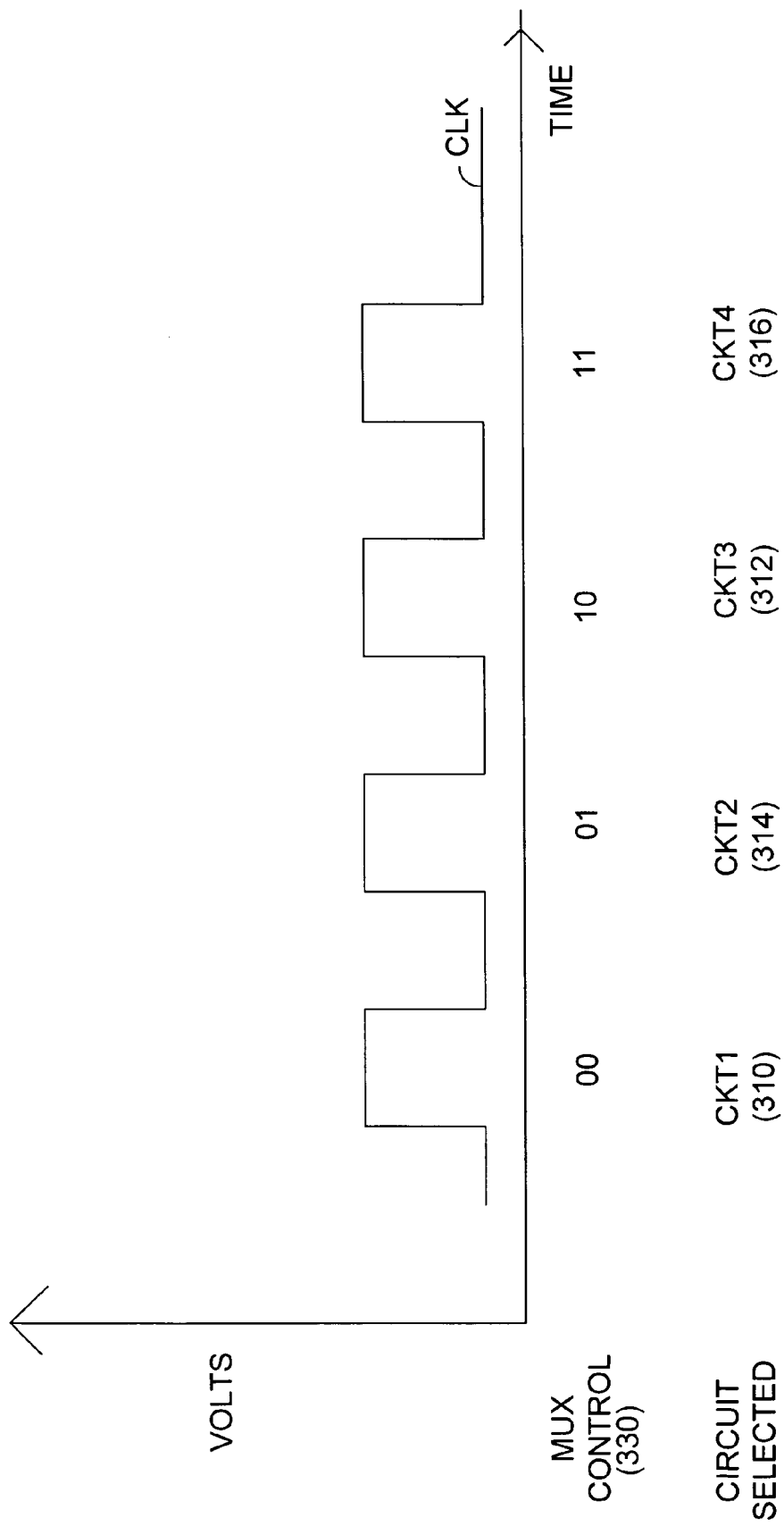
FIG. 3A is a timing diagram illustrating an example of how circuits are connected to an external component.

FIG. 3 is a drawing of an integrated circuit (IC), 300, with one external reference component, 320. Reference component 1, 320, is used to calibrate the circuits, CKT1, 310, CKT2, 314, CKT3, 312, and CKT4, 316 on the IC, 300 using multiplexer, 318. Control input, 330, to the multiplexer, 318, controls when each circuit is connected to the reference component, 320. FIG. 3A is a timing diagram illustrating an example of how circuits are connected to an external component. In this example, circuit CKT1 is connected to reference component 1, 320, when control input, 330, is 00. In this example, circuit CKT2 is connected to reference component 1, 320, when control input, 330, is 01. In this example, circuit CKT3 is connected to reference component 1, 320, when control input, 330, is 10. In this example, circuit CKT4 is connected to reference component 1, 320, when control input, 330, is 11. This example illustrates how the number of external components used for calibration may be reduced. This example also illustrates how the number of pads on an IC may be reduced.

Figure 4:
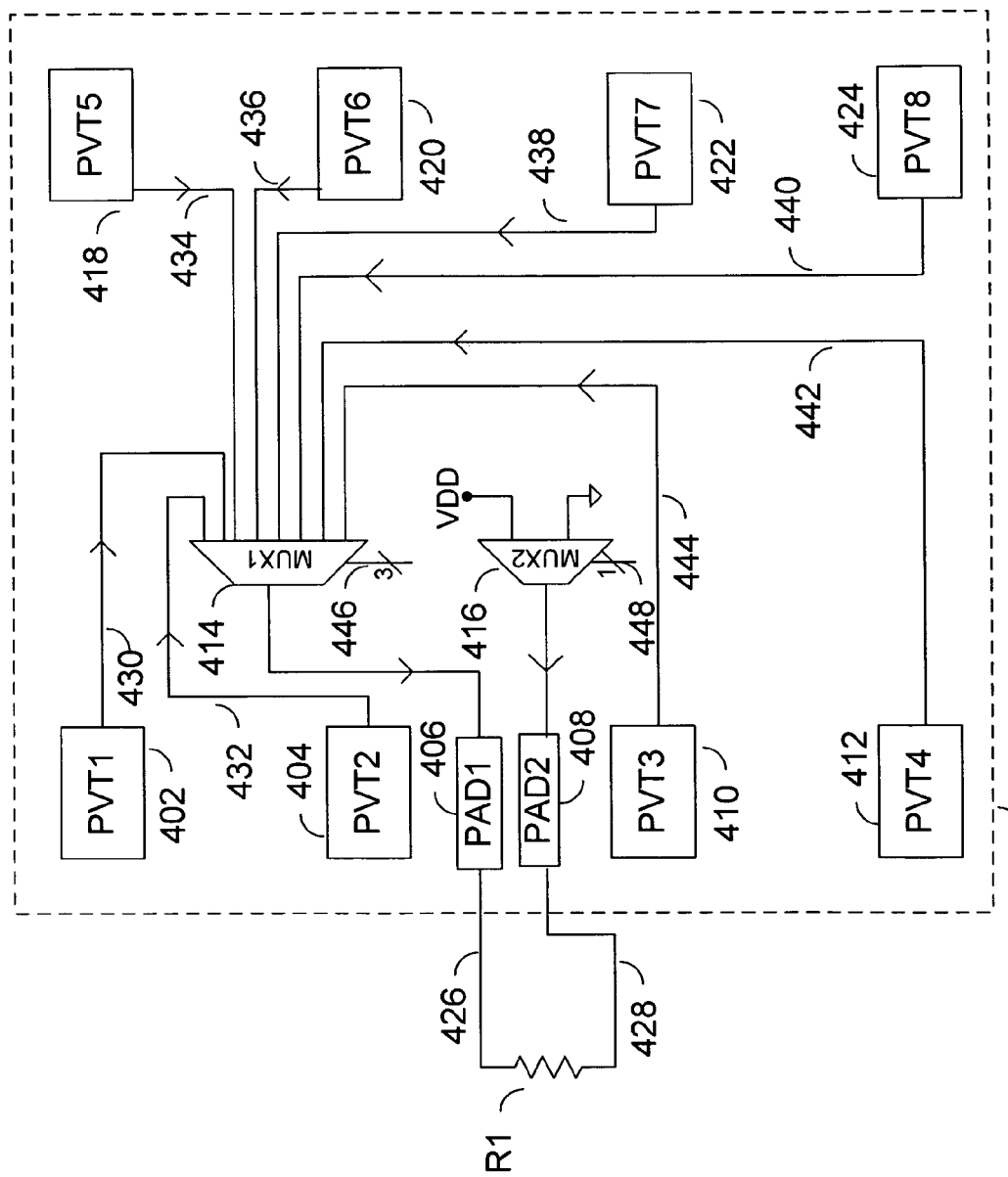
FIG. 4 is a drawing of an example of an IC with two multiplexers, two pads, eight PVT circuits and one external resistor.

FIG. 4 is a drawing of an example of an IC with two multiplexers, two pads, eight PVT circuits and one external resistor. The output, 430, of PVT1, 402, is connected to an input, 430, of MUX1, 414. The output, 432, of PVT2, 404, is connected to an input, 432, of MUX1, 414. The output, 444, of PVT3, 410, is connected to an input, 444, of MUX1, 414. The output, 442, of PVT4, 412, is connected to an input, 442, of MUX1, 414. The output, 434, of PVT5, 418, is connected to an input, 434, of MUX1, 414. The output, 436, of PVT6, 420, is connected to an input, 436, of MUX1, 414. The output, 438, of PVT7, 422, is connected to an input, 438, of MUX1, 414. The output, 440, of PVT8, 424, is connected to an input, 440, of MUX1, 414. The control input, 446, selects which output is connected to PAD1, 406. PAD1, 406, is connected to an end, 426, of a reference resistor, R1.

One input of MUX2, 416, is connected to VDD and another input of MUX2, 416 is connected to GND. Control input, 448, selects either VDD or GND. The output, 408, of MUX2, 416, is connected, to PAD2, 408. PAD2, 408, is connected to an end of resistor, R1. By selecting the proper combination of control inputs, 446 and 448, to MUX1, 414, and MUX2, 416, a P-type PVT circuit may be calibrated using resistor R1 connected to GND. By selecting the proper combination of control inputs, 446 and 448, to MUX1, 414, and MUX2, 416, a N-type PVT circuit may be calibrated using resistor R1 connected to VDD.

Figure 4A:
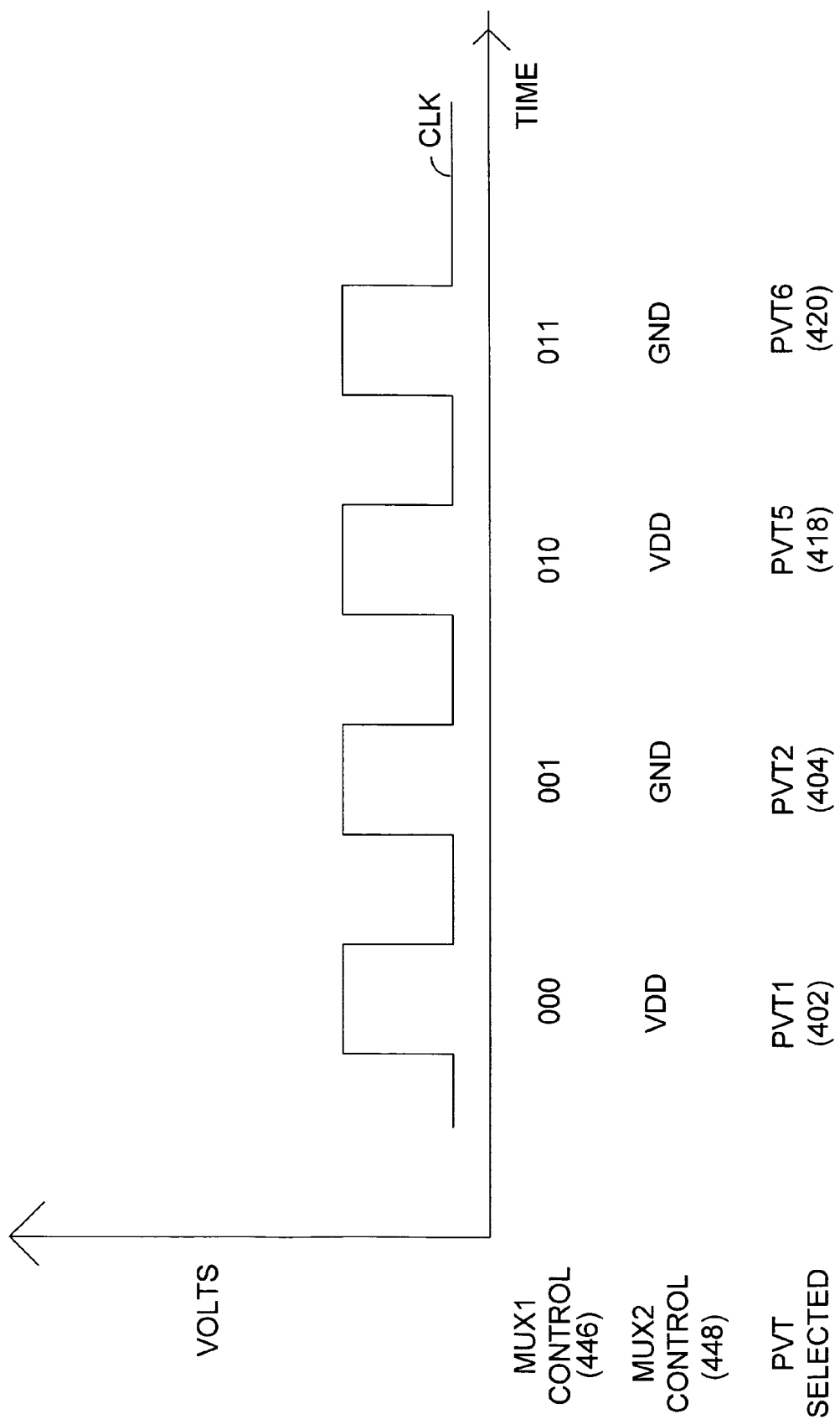
FIG. 4A is a timing diagram illustrating an example of how circuits are connected to an external component.

FIG. 4A is a timing diagram illustrating an example of how PVT circuits are connected to a single external resistor, R1. In this example, the output, 430, of circuit N-type PVT1, 402, is connected to one end of resistor, R1, 426, when control input, 446, is 000. The other end, 428, of resistor, R1, is connected to VDD when control input, 448, is 0. In this example, the output, 432, of circuit P-type PVT2, 404, is connected to one end of resistor, R1, 426, when control input, 446, is 001. The other end, 428, of resistor, R1, is connected to GND when control input, 448, is 1. In this example, the output, 434, of circuit N-type PVT5, 418, is connected to one end of resistor, R1, 426, when control input, 446, is 010. The other end, 428, of resistor, R1, is connected to VDD when control input, 448, is 0. In this example, the output, 436, of circuit P-type PVT6, 420, is connected to one end of resistor, R1, 426, when control input, 446, is 011. The other end, 428, of resistor, R1, is connected to GND when control input, 448, is 1. This example illustrates how the number of external components used for calibration may be reduced. This example also illustrates how the number of pads on an IC may be reduced.

The foregoing description of the present invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A system for reducing components comprising:
 a multiplexer located on an integrated circuit;
 a plurality of circuits located on the integrated circuit;
 a single component located external to the integrated circuit;
 wherein an output from each circuit in the plurality of circuits is connected to a
 separate data input of the multiplexer;
 wherein a data output of the multiplexer is connected to the single component;
 wherein a control input selects the data input to be connected to the component;
 such that each data input is individually connected to the component periodically;
 wherein each circuit in the plurality of circuits is a PVT circuit.

2. A system for reducing resistors comprising:
 a first multiplexer located on an integrated circuit;
 a second multiplexer located on an integrated circuit;
 a plurality of N-type PVT circuits located on the integrated circuit;
 a plurality of P-type PVT circuits located on the integrated circuit;
 a resistor located external to the integrated circuit;
 wherein an output from each circuit in the plurality of N-type PVT circuits is connected to a separate data input of the first multiplexer;
 wherein an output from each circuit in the plurality of P-type PVT circuits is connected to a separate data input of the first multiplexer;
 wherein a first data input to the second multiplexer is connected to VDD;
 wherein a second data input to the second multiplexer is connected to GND;
 wherein the output of the first multiplexer is connected to a first end of the resistor;
 wherein the output of the second multiplexer is connected to a second end of the resistor;
 wherein the control input of the first multiplexer selects the data input to be connected to the first end of the resistor;
 wherein the control input of the second multiplexer selects either GND or VDD to be connected to the second end of the resistor;
 such that each P-type PVT circuit in the plurality of P-type PVT circuits are periodically connected to the first end of the resistor while the second end of the resistor is connected to GND;
 such that each N-type PVT circuit in the plurality of N-type PVT circuits are periodically connected to the first end of the resistor while the second end of the resistor is connected to VDD.

3. A method for reducing components comprising:
 fabricating a multiplexer on an integrated circuit;
 fabricating a plurality of circuits on the integrated circuit;
 obtaining a single component located external to the integrated circuit;
 wherein an output from each circuit in the plurality of circuits is connected to a separate data input of the multiplexer;
 wherein a data output of the multiplexer is connected to the single component;
 wherein a control input selects the data input to be connected to the component;
 such that each data input is individually connected to the component periodically;
 wherein each circuit in the plurality of circuits is a PVT circuit.

4. A method for red using resistors comprising:
 fabricating a first multiplexer on an integrated circuit;
 fabricating a second multiplexer on an integrated circuit;
 fabricating a plurality of N-type PVT circuits on the integrated circuit;
 fabricating a plurality of P-type PVT circuits on the integrated circuit;
 obtaining a resistor external to the integrated circuit;
 wherein an output from each circuit in the plurality of N-type PVT circuits is connected to a separate data input of the first multiplexer;
 wherein an output from each circuit in the plurality of P-type PVT circuits is connected to a separate data input of the first multiplexer;
 wherein a first data input to the second multiplexer is connected to VDD;
 wherein a second data input to the second multiplexer is connected to GND;

wherein the output of the first multiplexer is connected to a first end of the resistor;

wherein the output of the second multiplexer is connected to a second end of the resistor;

wherein the control input of the first multiplexer selects the data input to be connected to the first end of the resistor;

wherein the control input of the second multiplexer selects either GND or VDD to be connected to the second end of the resistor;

such that each P-type PVT circuit in the plurality of P-type PVT circuits are periodically connected to the first end of the resistor while the second end of the resistor is connected to GND;

such that each N-type PVT circuit in the plurality of N-type PVT circuits are periodically connected to the first end of the resistor while the second end of the resistor is connected to VDD.

\* \* \* \* \*

UNITED STATES PATENT AND TRADEMARK OFFICE
CERTIFICATE OF CORRECTION

PATENT NO. : 7,411,440 B2  Page 1 of 1
APPLICATION NO. : 11/180096
DATED : August 12, 2008
INVENTOR(S) : Shad R. Shepston et al.

It is certified that error appears in the above-identified patent and that said Letters Patent is hereby corrected as shown below:

Title Pg, Item (54), Title: after "LOCATED" delete "IN" and insert -- ON --, therefor.

In column 1, line 1, after "LOCATED" delete "IN" and insert -- ON --, therefor.

In column 4, line 50, in Claim 4, delete "red using" and insert -- reducing --, therefor.

Signed and Sealed this

Eleventh Day of November, 2008

JON W. DUDAS
*Director of the United States Patent and Trademark Office*